(12) United States Patent
Feng et al.

(10) Patent No.: US 12,125,310 B2
(45) Date of Patent: *Oct. 22, 2024

(54) OPTICAL SENSOR ARRAY SUBSTRATE AND OPTICAL FINGERPRINT READER

(71) Applicants: BEIJING BOE SENSOR TECHNOLOGY CO., LTD., Beijing (CN); BOE TECHNOLOGY GROUP CO., LTD., Beijing (CN)

(72) Inventors: Yajie Feng, Beijing (CN); Cheng Li, Beijing (CN); Yue Geng, Beijing (CN); Kuiyuan Wang, Beijing (CN); Zefei Li, Beijing (CN); Chaoyang Qi, Beijing (CN); Yi Dai, Beijing (CN); Xiaoguan Li, Beijing (CN); Yingzi Wang, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/381,451

(22) Filed: Oct. 18, 2023

(65) Prior Publication Data

US 2024/0071127 A1 Feb. 29, 2024

Related U.S. Application Data

(63) Continuation of application No. 17/437,229, filed as application No. PCT/CN2020/132895 on Nov. 30, 2020, now Pat. No. 11,830,278.

(51) Int. Cl.
*G06V 40/13* (2022.01)
*H01L 23/552* (2006.01)
*H01L 27/146* (2006.01)

(52) U.S. Cl.
CPC ........ *G06V 40/1318* (2022.01); *H01L 23/552* (2013.01); *H01L 27/14603* (2013.01);
(Continued)

(58) Field of Classification Search
CPC .............. G06V 40/1318; H01L 23/552; H01L 27/14603; H01L 27/14612; H01L 27/1462;
(Continued)

(56) References Cited

U.S. PATENT DOCUMENTS

| 5,812,252 A | 9/1998 | Bowker et al. |
| 2012/0205743 A1 | 8/2012 | Chen et al. |

(Continued)

FOREIGN PATENT DOCUMENTS

| CN | 101931008 A | 12/2010 |
| CN | 105093750 A | 11/2015 |

(Continued)

OTHER PUBLICATIONS

U.S. Appl. No. 17/437,229—Notice of Allowance issued.

(Continued)

*Primary Examiner* — Antonio Xavier
(74) *Attorney, Agent, or Firm* — The Webb Law Firm

(57) ABSTRACT

An optical sensor array substrate and an optical fingerprint reader are provided. The optical sensor array substrate includes a substrate including a detection area which includes a plurality of photosensitive pixels. Photosensitive pixel includes: a TFT arranged on the substrate; a storage capacitor arranged on the substrate and having a first capacitor plate, and a second capacitor plate electrically connected to the source or drain of the TFT; a photosensitive element, having one end electrically connected to the second capacitor plate; a first electrode layer electrically connected to another end of the photosensitive element. On the substrate, (Continued)

an orthographic projection of the second capacitor plate at least partially overlaps with that of the first electrode layer, and the first capacitor plate is located in the same layer and has the same material as the gate of the TFT.

20 Claims, 8 Drawing Sheets

(52) U.S. Cl.
CPC .... *H01L 27/14612* (2013.01); *H01L 27/1462* (2013.01); *H01L 27/14623* (2013.01); *H01L 27/14636* (2013.01); *H01L 27/14678* (2013.01)

(58) Field of Classification Search
CPC ......... H01L 27/14623; H01L 27/14636; H01L 27/14678
See application file for complete search history.

(56) References Cited

U.S. PATENT DOCUMENTS

| | | | | |
|---|---|---|---|---|
| 2014/0070108 A1* | 3/2014 | Kim | ................ | H01L 27/14658 257/59 |
| 2015/0062088 A1* | 3/2015 | Cho | ................ | H01L 27/14632 438/96 |
| 2015/0369661 A1* | 12/2015 | Lin | ................ | G06V 40/1318 250/227.11 |
| 2017/0244921 A1* | 8/2017 | Velichko | ................ | H04N 25/75 |
| 2018/0158877 A1* | 6/2018 | Zeng | ................ | H10K 59/122 |
| 2019/0095674 A1 | 3/2019 | Ko et al. | | |
| 2019/0172844 A1 | 6/2019 | Su et al. | | |
| 2020/0064497 A1* | 2/2020 | Wu | ................ | G01T 1/244 |
| 2020/0135833 A1 | 4/2020 | Ma et al. | | |

FOREIGN PATENT DOCUMENTS

| | | |
|---|---|---|
| CN | 105304656 A | 2/2016 |
| CN | 106950771 A | 7/2017 |
| CN | 107680988 A | 2/2018 |
| CN | 109410772 A | 3/2019 |
| CN | 109584711 A | 4/2019 |
| CN | 109863509 A | 6/2019 |
| CN | 111856819 A | 10/2020 |
| WO | 2020150938 A1 | 7/2020 |
| WO | 2021042283 A1 | 3/2021 |

OTHER PUBLICATIONS

EP Application 20963082.1—Extended European Search Report.
International Application No. PCT/CN2020/132895—International Search Report.
International Application No. PCT/CN2020/132895—Written Opinion.

* cited by examiner

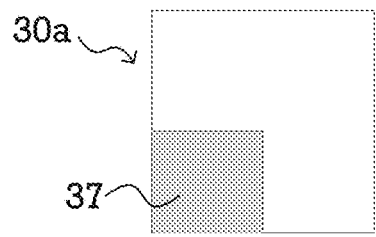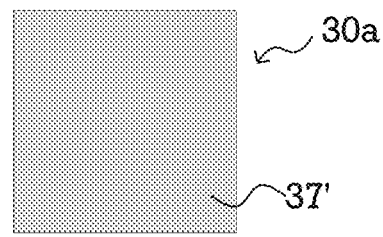
Fig. 8A    Fig. 8B
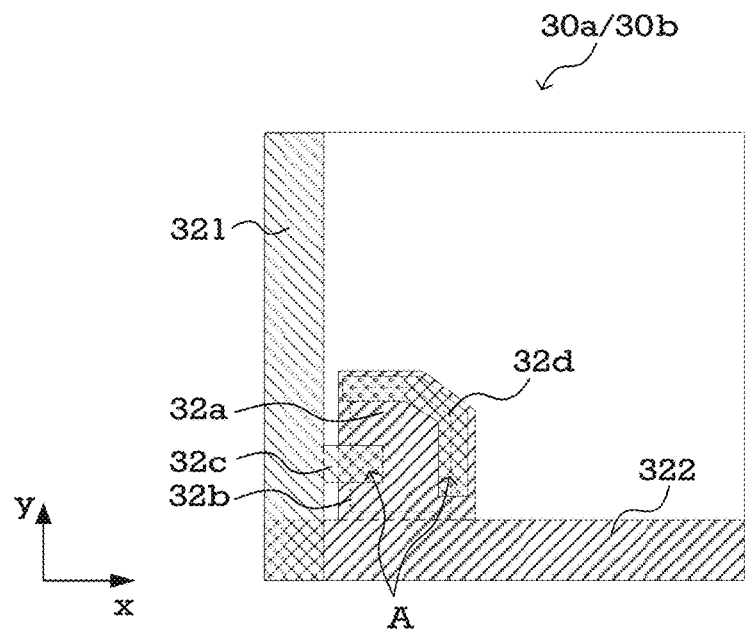
Fig. 9
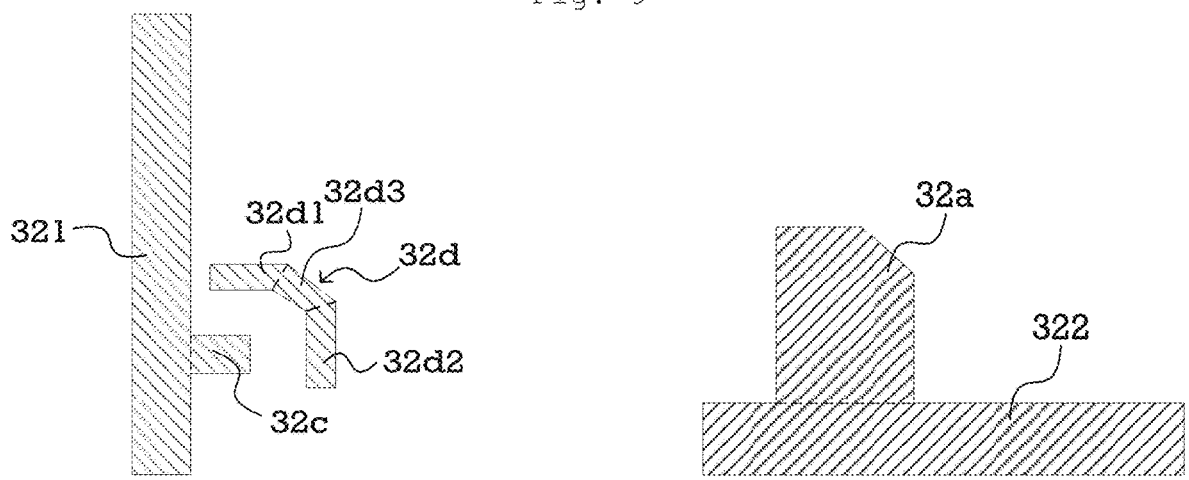
Fig. 10A    Fig. 10B

OPTICAL SENSOR ARRAY SUBSTRATE AND OPTICAL FINGERPRINT READER

CROSS-REFERENCE TO RELATED APPLICATION

This application is a continuation of U.S. patent application Ser. No. 17/437,229, filed on Nov. 30, 2020, which is the United States national phase of International Application No. PCT/CN2020/132895 filed Nov. 30, 2020, the disclosures of which are hereby incorporated by reference in their entirety.

TECHNICAL FIELD

The present disclosure relates to the field of sensors, in particular to an optical sensor array substrate and an optical fingerprint reader.

BACKGROUND

Based on the uniqueness of fingerprints, fingerprint imaging recognition technology is widely applied in fingerprint acquisition, cell phone fingerprint lock and other fields. For an optical fingerprint reader, the optical sensor is a key device for realizing fingerprint acquisition, which converts a received light signal reflected by a finger surface into an electrical signal so as to realize fingerprint acquisition.

SUMMARY

In one aspect of the present disclosure, an optical sensor array substrate is provided. The optical sensor array substrate includes a substrate, the substrate including a detection area and a peripheral area surrounding the detection area, wherein, the detection area includes a plurality of photosensitive pixels, at least one of which includes: a thin film transistor arranged on the substrate and having a gate, an active layer, a source and a drain; a storage capacitor arranged on the substrate and having a first capacitor plate and a second capacitor plate, wherein the second capacitor plate is located on one side of the first capacitor plate away from the substrate and electrically connected to the source or drain of the thin film transistor; a photosensitive element located on one side of the storage capacitor away from the substrate and having one end electrically connected to the second capacitor plate; a first electrode layer located on one side of the photosensitive element away from the substrate and electrically connected to another end of the photosensitive element, wherein an orthographic projection of the second capacitor plate on the substrate at least partially overlaps with an orthographic projection of the first electrode layer on the substrate.

In some embodiments, the first capacitor plate is located in the same layer and has the same material as the gate of the thin film transistor, and the second capacitor plate is located in the same layer and has the same material as the source and the drain of the thin film transistor.

In some embodiments, the first capacitor plate is located in the same layer and has the same material as the gate of the thin film transistor, and the second capacitor plate and the source and the drain of the thin film transistor are located in different layers respectively.

In some embodiments, an orthographic projection of the photosensitive element on the substrate is located within orthographic projections of the second capacitor plate and the first capacitor plate on the substrate.

In some embodiments, the photosensitive pixels include: a readout data line extending along a first direction, and located in the same layer as and connected to the source of the thin film transistor; and a gate line extending along a second direction, and located in the same layer as and connected to the gate of the thin film transistor, wherein the second direction is perpendicular to the first direction; wherein one end of the source of the thin film transistor is connected to the readout data line, and another end of the source of the thin film transistor extends along the second direction relative to the readout data line; the drain of the thin film transistor is L-shaped, and has a first portion, a second portion, and a corner portion connecting the first portion and the second portion, wherein the first portion extends along a direction opposite to the first direction relative to the corner portion, and the second portion extends along a direction opposite to the second direction relative to the corner portion; one end of the gate of the thin film transistor is connected to the gate line, and another end of the gate of the thin film transistor extends along the first direction relative to the gate line, wherein an orthographic projection of the gate of the thin film transistor on the substrate partially overlaps with orthographic projections of both the drain and the source of the thin film transistor on the substrate respectively.

In some embodiments, at least one of the plurality of photosensitive pixels further includes: a first light-shielding metal layer located on one side of the thin film transistor and the photosensitive element away from the substrate, wherein an orthographic projection of the first light-shielding metal layer on the substrate at least partially overlaps with an orthographic projection of the thin film transistor on the substrate, and an orthographic projection of the first light-shielding metal layer does not overlap with an orthographic projection of the photosensitive element on the substrate.

In some embodiments, the peripheral area includes a dummy area located on at least one side of the detection area, the dummy area includes a plurality of dummy pixels, at least one of the plurality of dummy pixels includes the thin film transistor, the storage capacitor, the photosensitive element, the first electrode layer and the second light-shielding metal layer, wherein the second light-shielding metal layer is located on one side of the thin film transistor and the photosensitive element away from the substrate, and an orthographic projection of the thin film transistor and the photosensitive element on the substrate is located within an orthographic projection of the second light-shielding metal layer on the substrate.

In some embodiments, each of the plurality of dummy pixels includes the second light-shielding metal layer, and the second light-shielding metal layer of the plurality of dummy pixels entirely covers the dummy area.

In some embodiments, at least one of the plurality of dummy pixels and the plurality of photosensitive pixels includes: a gate insulating layer located on one side of the substrate adjacent to the active layer of the thin film transistor and covering the gate of the thin film transistor; a first passivation layer located on one side of the source and the drain of the thin film transistor away from the substrate, and covers the source and the drain of the thin film transistor; a planarization layer located on one side of the first passivation layer away from the substrate; a second passivation layer located on one side of the planarization layer away from the substrate, wherein the source and the drain of the thin film transistor are located on a surface of one side of the gate insulating layer away from the substrate, the photosensitive element is located within the planarization layer and electrically connected to the second capacitor plate through a via hole penetrating through the first passivation layer, and the first electrode layer is electrically connected to the photosensitive element.

In some embodiments, at least one of the plurality of dummy pixels and the plurality of photosensitive pixels includes: a second electrode layer electrically connected to a bias voltage signal terminal, located on one side of the second passivation layer away from the substrate, and electrically connected to the first electrode layer through a via hole penetrating through the second passivation layer and the planarization layer.

In some embodiments, the plurality of photosensitive pixels and the plurality of dummy pixels are arranged in a plurality of rows and a plurality of columns according to a row direction and a column direction of an array, and each column of photosensitive pixels and each column of dummy pixels both include a readout data line continuously extending along the column direction and a gate line continuously extending along the row direction; wherein second electrode layers of each row of photosensitive pixels are sequentially connected along the column direction to form an entirety of the second electrode layer, and an orthographic projection of the entirety of the second electrode layer on the substrate partially overlaps with an orthographic projection of each column of photosensitive pixels on the substrate, and does not partially or wholly overlap with the readout data line of each column of photosensitive pixels; and/or second electrode layers of each column of dummy pixels are sequentially connected along the column direction to form an entirety of the second electrode layer, and an orthographic projection of the entirety of the second electrode layer on the substrate partially overlaps with an orthographic projection of each column of dummy pixels on the substrate, and does not partially or wholly overlap with the readout data line of each column of dummy pixels.

In some embodiments, at least one of the plurality of dummy pixels and the plurality of photosensitive pixels includes: a third passivation layer located on one side of the second passivation layer away from the substrate; and an electrostatic shielding layer located on one side of the third passivation layer away from the substrate.

In some embodiments, the optical sensor array substrate further includes: an electrostatic discharge area located on one side of the dummy area away from the detection area and having a plurality of electrostatic discharge units, wherein the plurality of photosensitive pixels and the plurality of dummy pixels are arranged in a plurality of rows and a plurality of columns according to a row direction and a column direction of an array, wherein the plurality of electrostatic discharge units are arranged according to the column direction, and in a one-to-one correspondence with the plurality of rows of photosensitive pixels and dummy pixels.

In some embodiments, at least one of the plurality of electrostatic discharge units includes: a first transistor having a gate, a source and a drain; a second transistor having a gate, a source and a drain, wherein the gate of the first transistor is electrically connected to the drain of the first transistor, and configured to be connected to a gate signal output terminal of a gate circuit, the drain of the second transistor is electrically connected to the source of the first transistor, the gate of the second transistor and the source of the second transistor are both configured to be connected to a first voltage terminal, and a voltage of the first voltage terminal is lower than a gate signal voltage of the gate signal output terminal.

In some embodiments, the peripheral area includes a dummy area located on at least one side of the detection area; the dummy area includes a plurality of dummy pixels, at least one of which includes: the thin film transistor, the storage capacitor, and a second light-shielding metal layer, wherein the second light-shielding metal layer is located on one side of the thin film transistor away from the substrate, and an orthographic projection of the thin film transistor on the substrate is located within an orthographic projection of the second light-shielding metal layer on the substrate.

In some embodiments, the peripheral area includes a dummy area located on at least one side of the detection area; the dummy area includes a plurality of dummy pixels, at least one of which includes: the thin film transistor, the storage capacitor, the second light-shielding metal layer, and a dummy element, wherein the dummy element includes a material that has the same dielectric constant as the photosensitive element and does not have a photosensitive property, the second light-shielding metal layer is located on one side of the thin film transistor away from the substrate, and an orthographic projection of the thin film transistor on the substrate is located within an orthographic projection of the second light-shielding metal layer on the substrate.

In some embodiments, the peripheral area includes a dummy area located on at least one side of the detection area; the dummy area includes a plurality of dummy pixels, at least one of which includes: the thin film transistor, the storage capacitor, and a dummy element, wherein the dummy element includes a material that has the same dielectric constant as the photosensitive element and does not have a photosensitive property.

In some embodiments, the peripheral area includes a bonding area located on at least one side of the detection area; the bonding area includes: a plurality of first fanout metal structures electrically connected to readout data lines of respective column of photosensitive pixels and dummy pixels; and a plurality of second fanout metal structures electrically connected to gate lines of respective rows of photosensitive pixels and dummy pixels.

In some embodiments, at least one of the plurality of first fanout metal structures and the plurality of second fanout metal structures includes a bimetal layer including: a first metal layer located in the same layer and having the same material as the readout data lines; and a second metal layer located in the same layer and having the same material as the gate lines, and electrically connected to the first metal layer through a via hole penetrating through the gate insulating layer.

In another aspect of the present disclosure, an optical fingerprint reader is provided. The optical fingerprint reader includes: a backlight module; the aforementioned optical sensor array substrate, which is located on a light emitting side of the backlight module; and a driving circuit board electrically connected to the backlight module and signally connected to the optical sensor array substrate.

In some embodiments, the optical fingerprint reader further includes: a filter layer located on one side of the optical sensor array substrate away from the backlight module, wherein a material of the filter layer includes a filter material which is configured to intercept light beyond a preset wavelength range and transmit light within a preset wavelength range, wherein the preset wavelength range is 450~500 nm.

In some embodiments, the optical fingerprint reader further includes: a hard coating layer located on one side of the filter layer away from the backlight module, wherein a material of the hard coating layer includes a periodic laminated structure formed by two materials of SiO2 and Si3C4 alternately.

In some embodiments, the optical fingerprint reader further includes: an anti-fingerprint layer located on one side of the hard coating layer away from the backlight module.

In some embodiments, the backlight module includes: a backplane; a light guide plate located on one side of the backplane adjacent to the optical sensor array substrate; a reverse prism located on a surface of one side of the light guide plate away from the backplane; and a privacy film located on a surface of one side of the privacy film away from the backplane.

In some embodiments, the optical fingerprint reader further includes: two groups of readout circuits located on a first side and a second side of the optical sensor array substrate and electrically connected to the driving circuit board, wherein the first side is an side opposite to the second side, wherein the optical sensor array substrate has two dummy areas located on a third side and a fourth side of the detection area, wherein the third side is an side opposite to the fourth side, and the third side and the fourth side are both adjacent to the first side and the second side; the dummy area includes a plurality of dummy pixels; the plurality of photosensitive pixels and the plurality of dummy pixels are arranged in a plurality of rows and a plurality of columns according to a row direction and a column direction of an array, and collectively divided into a plurality of pixel groups according to columns; and each group of readout circuits include a plurality of readout circuits; pins of all the readout circuits among the two groups of readout circuits are electrically connected to the plurality of pixel groups in a one-to-one correspondence through a first fanout metal structure, and all the readout circuits among the two groups of readout circuits are alternately arranged in the row direction.

In some embodiments, the optical fingerprint reader further includes: two gate circuits located on a third side of the optical sensor array substrate and electrically connected to the plurality of photosensitive pixels and the plurality of dummy pixels through a second fanout metal structure; and a flexible circuit board located on a third side of the optical sensor array substrate and located between the two gate circuits, such that pins of the flexible circuit board are electrically connected to pins of the two gate circuits, and electrically connected to the driving circuit board through a metal trace, wherein the metal trace has a width of greater than 40 µm.

In some embodiments, the optical fingerprint reader further includes: a light-absorbing plastic frame located on one side of the optical sensor array substrate away from the backlight module, wherein a non-light-absorbing portion of the light-absorbing plastic frame exposes the detection area and the two dummy areas.

BRIEF DESCRIPTION OF THE DRAWINGS

The accompanying drawings, which constitute part of this specification, illustrate exemplary embodiments of the present disclosure and serve to explain the principles of the present disclosure together with this specification.

The present disclosure may be more clearly understood from the following detailed description with reference to the accompanying drawings, in which:

FIGS. 8A and 8B are schematic views of the coverage areas of the light-shielding metal layer in the detection area and the dummy area in FIG. 5;

FIG. 9 is a schematic view of overlapping the gate with the source and the drain of TFT in an embodiment of the optical sensor array substrate according to the present disclosure;

FIG. 10A is a schematic view of the arrangement of a readout data line, and a source and drain of TFT in an embodiment of the optical sensor array substrate according to the present disclosure;

FIG. 10B is a schematic view of the arrangement of a gate line and a gate of TFT in an embodiment of the optical sensor array substrate according to the present disclosure;

Figure 1:
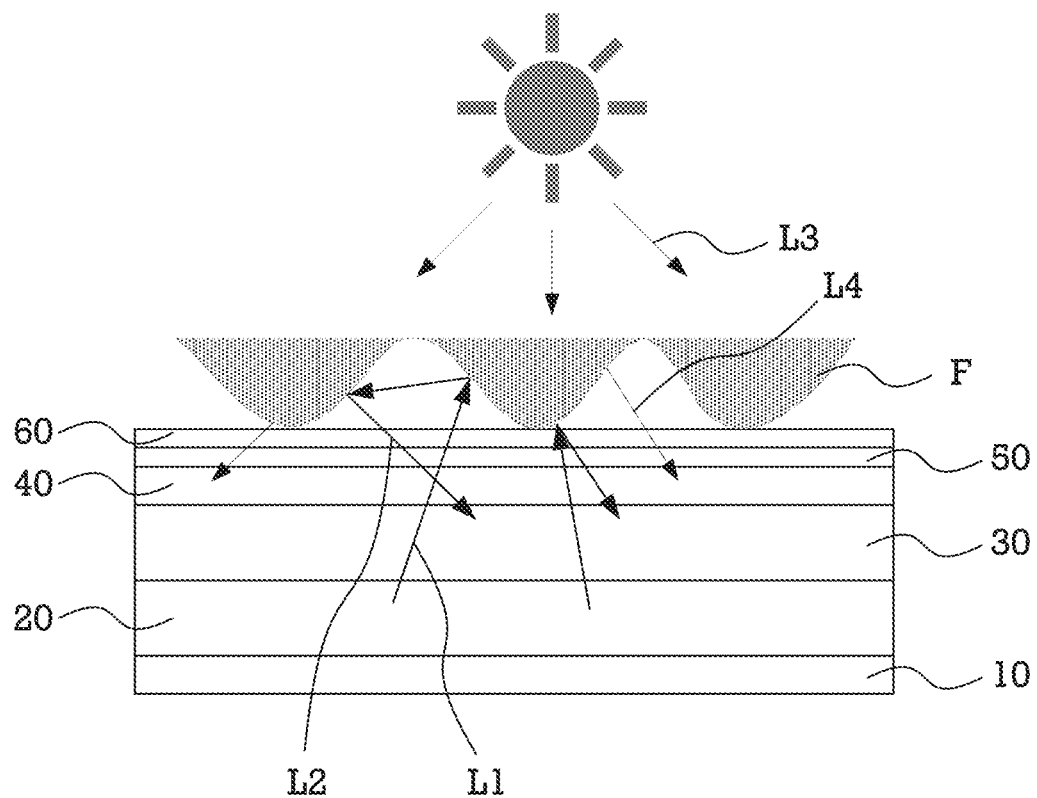
FIG. 1 is a schematic view of the structure and operation principles in an embodiment of the optical fingerprint reader according to the present disclosure.

It should be understood that the dimensions of the various parts shown in the accompanying drawings are not drawn according to actual scaling relations. In addition, the same or similar components are denoted by the same or similar reference signs.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to the other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, the optical fingerprint reader needs to be improved in the resistance to intense light. In view of this, the present disclosure provides an optical sensor array substrate and an optical fingerprint reader, which are capable of effectively improving the resistance to intense light.

Figure 2:
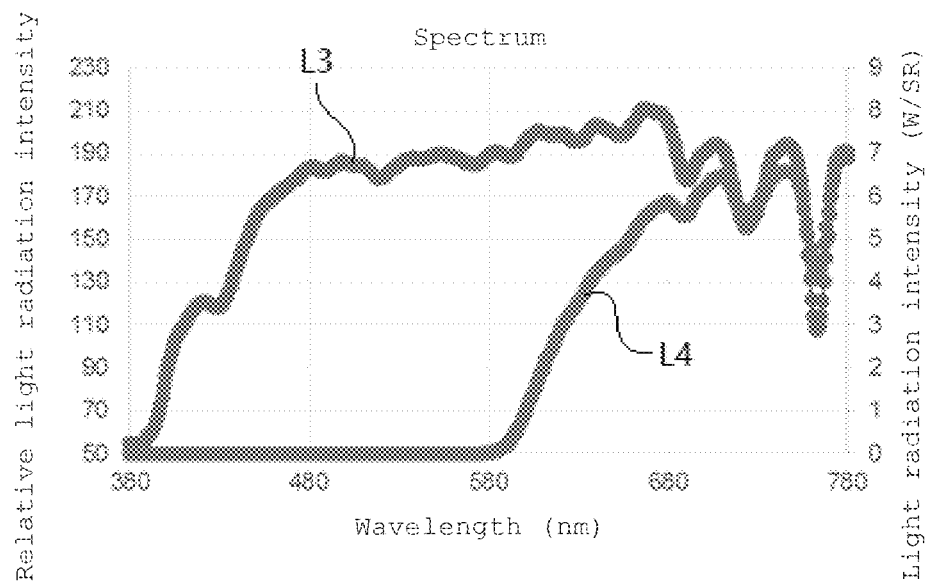
FIG. 2 is a schematic view of the spectrum of sunlight transmitted through a finger.

FIG. 1 is a schematic view of the structure and operation principles in an embodiment of the optical fingerprint reader according to the present disclosure. FIG. 2 is a schematic view of the spectrum of sunlight transmitted through a finger.

Referring to FIG. 1, in some embodiments, the optical fingerprint reader includes a driving circuit board 10, a backlight module 20 and an optical sensor array substrate 30. The driving circuit board 10 may be arranged on one side of the backlight module 20 away from the optical sensor array substrate 30 and electrically connected to the optical sensor array substrate 30 for driving the optical sensor array substrate 30. The driving circuit board 10 may also be electrically connected to the backlight module 20 for driving the backlight module 20, for example, driving the backlight module 20 to emit different intensities of backlight.

In some embodiments, the driving circuit board 10 includes a Field Programmable Gate Array (referred to FPGA for short). In other embodiments, the driving circuit board 10 may include a microprocessor, for example an X86 processor or an ARM processor, or a digital signal processor (referred to DSP for short).

The optical sensor array substrate 30 is located on a light emitting side of the backlight module 20. In FIG. 1, the backlight module 20 is located below the optical sensor array substrate. The light L1 emitted by the backlight module 20 reaches the surface of a finger F through a light transmission portion of the optical sensor array substrate 10, and after reflection by valleys and ridges on the surface of the finger F, the reflected light L2 returns to the optical sensor array substrate 20 and is sensed by a photosensitive element in the substrate 20.

For the light L1 reaching the finger, part of the light reaching a valley of the finger is subjected to a substantial loss during the reflection process, so that the reflected light L2 of the valley is weak, whereas part of the light reaching a ridge of the finger is directly reflected to reach the optical sensor array substrate 30, so that the reflected light L2 of the ridge is strong. The optical sensor array substrate 20 receives different intensities of reflected light from different parts of the finger surface, and performs photoelectric conversion so as to identify fingerprint valley/ridge information.

Considering that the optical fingerprint reader might be used in an environment of intense light (for example, the sunlight exposure environment shown in FIG. 1) where ambient intense light (for example, the sunlight L3) is a great disturbance factor for the backlight, when the optical fingerprint reader is designed, there is a need to improve its resistance to ambient intense light. Since there is blood continuously circulating in the finger F, the hemoglobin in the blood and the finger muscles may absorb light other than red light in the ambient intense light, which results in that the light L4 transmitted through the finger is red light. Further, with stratum corneum of a finger surface, the light L1 of the backlight that reaches the finger does not enter an interior of the finger, and thus may not be converted into red light.

Referring to FIG. 2, the sunlight L3 involves an entire wave band of the visible light, and the light L4 transmitted through the finger is mainly the visible light with a wavelength greater than 580 nm (i.e., red light and orange light). In order to overcome the disturbance of the red light transmitted through the finger on the backlight, referring to FIG. 1, in some embodiments, the optical fingerprint reader further includes a filter layer 40 located on one side of the optical sensor array substrate 30 away from the backlight module 20. The material of the filter layer 40 includes a filter material. The filter material is configured to intercept light beyond a preset wavelength range and transmit light within the preset wavelength range.

The preset wavelength range here may be set to 450~500 nm, so that part of the light reaching the filter layer 40 with a peak wavelength of 450~500 nm may be transmitted through the filter layer 40 as much as possible to reach the optical sensor array substrate 10. For example, the transmittance is greater than 90%. For the light after transmission through the finger with a wavelength of less than 450 nm or greater than 500 nm, it may be intercepted by the filter layer 40 (for example, the transmittance is less than 0.3%) and thus cannot reach the optical sensor array substrate 30. In this way, it is possible to improve the accuracy of the optical fingerprint reader.

In some embodiments, the filter layer 40 may be formed on the surface of the optical sensor array substrate 30 by a coating process (for example, a spin coating process or the like), and the filter material used may be resin or ink. In other embodiments, the filter layer 40 may also be arranged on another structure (for example, a transparent cover plate) independent of the optical sensor array substrate 30, and the filter layer 40 is located on one side of the optical sensor array substrate 30 away from the backlight module 20.

Considering that the filter material used for the filter layer 40 is normally soft, in order to reinforce the hardness of the optical fingerprint reader and avoid scratch of the optical fingerprint reader, referring to FIG. 1, in some embodiments, the optical fingerprint reader further includes a hard coating layer 50. The hard coating layer 50 is located on one side of the filter layer 40 away from the backlight module 20. In some embodiments, the material of the hard coating layer 50 may include a periodic laminated structure formed by $SiO_2$ and $Si_3C_4$ alternately. By means of the laminated structure, it is possible to realize a superhard film having high-transmittance, thereby effectively improving the hardness of the optical fingerprint reader.

In order to prevent remaining fingerprints of the user on the optical fingerprint reader during use, referring to FIG. 1, in some embodiments, the optical fingerprint reader further includes an anti-fingerprint layer 60 located on one side of the hard coating layer 50 away from the backlight module 20. In some embodiments, the anti-fingerprint layer 60 may be made from an organic fluoride material, so that it is possible to prevent fingerprints from remaining on the surface of the optical fingerprint reader and make it easier for cleaning.

Figure 3:
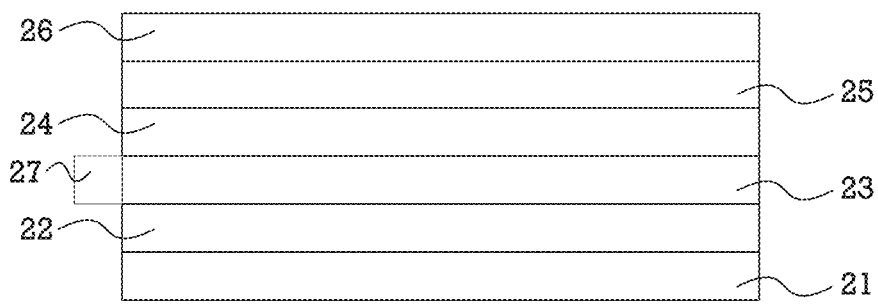
FIG. 3 is a schematic view of the structure of the backlight module in an embodiment of the optical fingerprint reader according to the present disclosure.

FIG. 3 is a schematic view of the structure of the backlight module in an embodiment of the optical fingerprint reader according to the present disclosure.

Referring to FIG. 3, in some embodiments, the backlight module 20 includes: a backplane 21 and a light guide plate 23. The light guide plate 23 is located on one side of the backplane 21 adjacent to the optical sensor array substrate 30. In FIG. 3, the backlight module 20 may further include a reflective sheet 22, a light source 27 and a frame bonding 26. In FIG. 3, the reflective sheet 22 is located on one side of the backplane 21, and the light guide plate 23 is located on one side of the reflective sheet 22 away from the backplane 21. The light source 27 is located on one side of the light guide plate 23 along a direction perpendicular to a light emitting direction of the light guide plate 23 so as to form an edge type backlight module. In other embodiments, the light source may also be arranged on one side in a direction opposite to a light emitting direction of the light guide plate 23 so as to form a direct type backlight module. The frame bonding 26 may be located on one side of the light guide plate 23 away from the backplane 21 so as to protect the backlight module 20.

In order to meet the requirements of the overall image uniformity of the optical fingerprint reader, the backlight module 20 needs to increase the valley and ridge difference whilst ensuring the uniformity of the entire surface. Correspondingly, referring to FIG. 3, in some embodiments, the backlight module 20 further includes a reverse prism 24 and a privacy film 25. The reverse prism 24 which is located on one side of the light guide plate 23 away from the backplane 21, may refract the light emitted from the light guide plate 23 into a direction perpendicular to the surface of the optical sensor array substrate 30, thereby achieving the light collimation effect. The privacy film 25 achieves the light collimation effect by constraining the light. The reverse prism 24 and the privacy film 25 are combined to achieve a better light collimation effect and improve the overall image uniformity of the optical fingerprint reader.

Figure 4A:
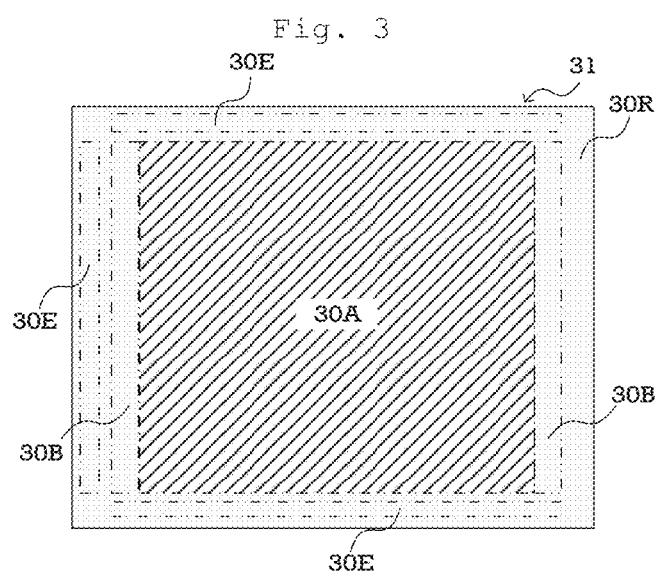
FIG. 4A is a schematic view of the arrangement of a detection area and a peripheral area in the substrate in an embodiment of the optical sensor array substrate according to the present disclosure.
Figure 4B:
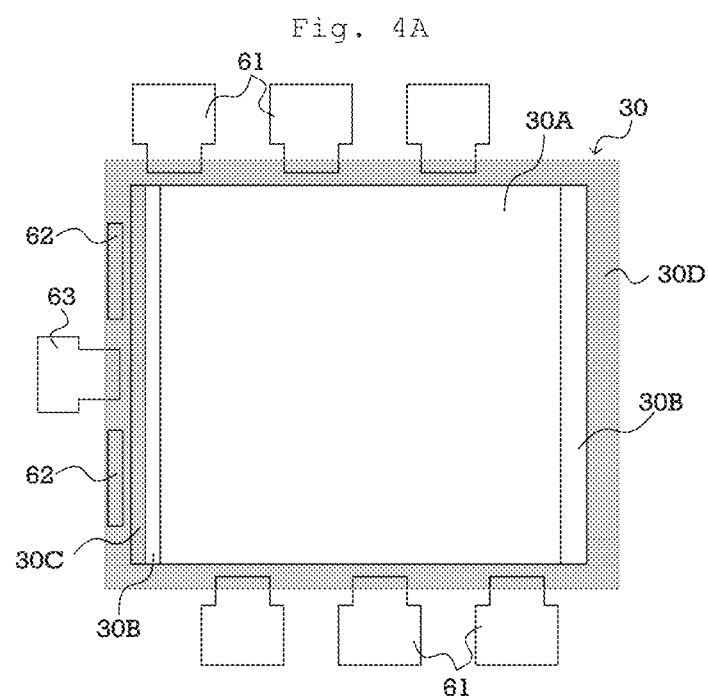
FIG. 4B is a schematic view of a combined structure of an optical sensor array substrate, a readout circuit, a gate circuit and a flexible circuit board in an embodiment of the optical fingerprint reader according to the present disclosure.
Figure 5:
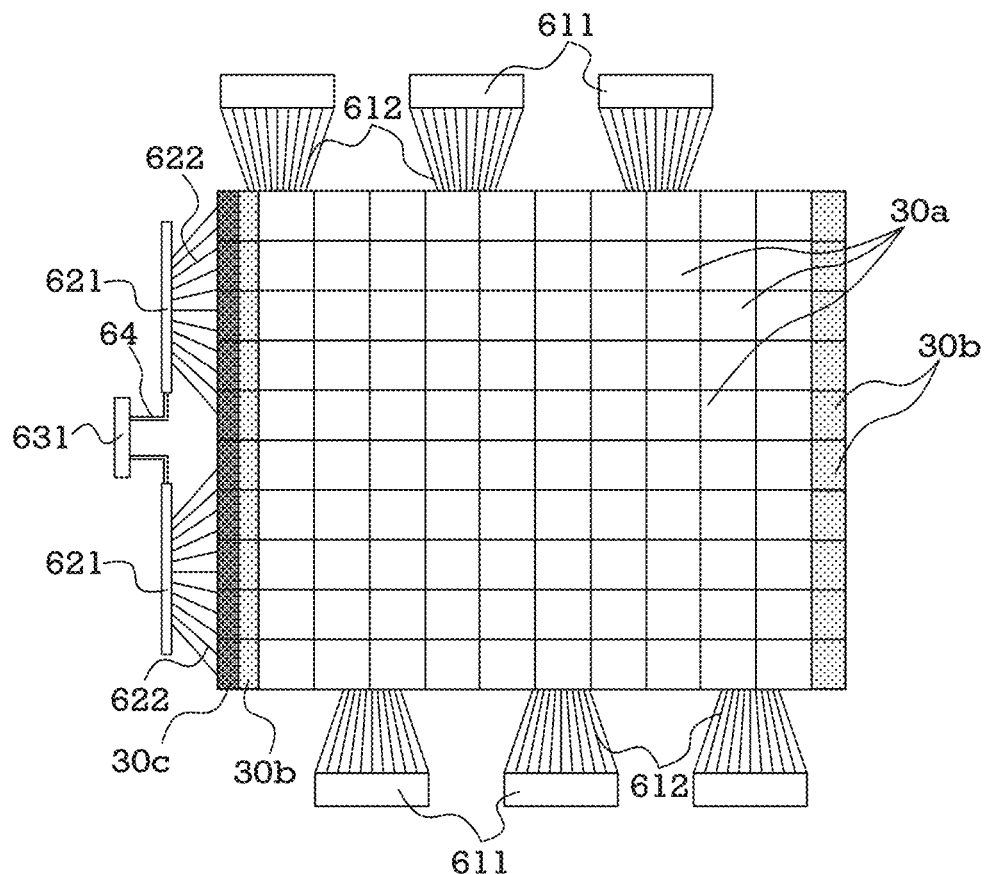
FIG. 5 is a schematic view of the structure connecting an array substrate, a readout circuit pin, a gate circuit pin and a flexible circuit board pin in an embodiment of the optical sensor array substrate according to the present disclosure.

FIG. 4A is a schematic view of the arrangement of a detection area and a peripheral area in the substrate in an embodiment of the optical sensor array substrate according to the present disclosure. FIG. 4B is a schematic view of a combined structure of an optical sensor array substrate, a readout circuit, a gate circuit and a flexible circuit board in an embodiment of the optical fingerprint reader according to the present disclosure. FIG. 5 is a schematic view of the connection structure of an array substrate, a readout circuit pin, a gate circuit pin and a flexible circuit board pin in an embodiment of the optical sensor array substrate according to the present disclosure.

Referring to FIGS. 4A, 4B and 5, in some embodiments, the optical fingerprint reader further includes a readout circuit (Readout Integrated Circuit, referred to ROIC for short) 61, a gate circuit (Gate IC) 62, and a flexible printed circuit board (Flexible Printed Circuit, referred to FPC for short) 63. The readout circuit 61, the gate circuit 62 and the flexible circuit board 63 are located at a periphery of the optical sensor array substrate 30. The readout circuit 61 and the flexible circuit board 63 are electrically connected to the driving circuit board 10 respectively, and the gate circuit 62 is electrically connected to the flexible circuit board 63 through a metal trace 64. The driving circuit board 10 may realize the fine control of an operation state of the optical sensor array substrate 30 by means of the readout circuit 61, the gate circuit 62 and the flexible circuit board 63.

Referring to FIGS. 4A and 4B, in some embodiments, the optical sensor array substrate 30 includes a substrate 31 that includes a detection area 30A (AA area) and a peripheral area 30R surrounding the detection area 30A. In some embodiments, the peripheral area 30R may include a dummy area 30B and a bonding area 30E. In FIG. 5, the detection area 30A includes a plurality of photosensitive pixels 30a. The dummy area 30B also includes a plurality of dummy pixels 30b. The dummy pixel 30b is configured to collect noises in a dark state, that is, noise signals resulting from non-illuminating reasons, for representing the noises of each row of photosensitive pixels 30a, so as to reduce the random noises of each row of photosensitive pixels 30a by means of compensation.

The plurality of photosensitive pixels 30a and the plurality of dummy pixels 30b are arranged in a plurality of rows and a plurality of columns according to a row direction and column direction of the arrays. The plurality of photosensitive pixels 30a and the plurality of dummy pixels 30b may be collectively divided into a plurality of pixel groups according to the column. For example, the resolution of the detection area 30A is 1600×1500, the pixel pitch is 50.8 μm, and two columns of dummy pixels 30b and a plurality of columns of photosensitive pixels may be totally divided into six groups according to the column. The first group consists in the first column of dummy pixels and 1~255 rows of photosensitive pixels counting from the left, the second group consists in 256~511 rows of photosensitive pixels, the third group consists in 512~767 rows of photosensitive pixels, and so forth for the fourth to sixth groups sequentially.

In FIG. 4B, the optical fingerprint reader includes two groups of readout circuits 61 respectively located on the first and second sides of the optical sensor array substrate 30, wherein the first side is one side opposite to the second side (for example, the left side and right sides in FIG. 4B). In some embodiments, the dummy area 30B is arranged on at least one side of the detection area 30A. For example, in FIGS. 4B and 5, the two dummy areas 30B are located on the third and fourth side of the detection area 30A respectively (for example, the upper side and lower side in FIG. 4B), and the third side is one side opposite to the fourth side, and the third side and the fourth side are both adjacent to the first side and the second side.

Referring to FIGS. 4A and 5, in some embodiments, the bonding area 30E is located on at least one side of the detection area 30A, for example, located on the upper side, the lower sides and the left side of the detection area 30A. The bonding area 30E includes a plurality of first fanout metal structures 612 and a plurality of second fanout metal structures 622.

In FIG. 4B, each group of readout circuits 61 includes three readout circuits 61. The pins 611 of the three readout circuits 61 located on the first side of the optical sensor array substrate 30 are electrically connected to the first, third and fifth group of pixels through the first fanout metal structure 612 in the bonding area 30E, so as to respectively read out the sensing signal of each photosensitive pixel 30a and dummy pixel 30b in the three groups. The pins 611 of the three readout circuits 61 located on the second side of the optical sensor array substrate 30 in FIG. 4B are electrically connected to the second, fourth and sixth groups of pixels in the bonding area 30E through the first fanout metal structure 612 in the bonding area 30W, so as to read out the sensing signals of each photosensitive pixel 30a and dummy pixel 30b in the three groups respectively, thereby implementing reading out the sensing signals of all rows of photosensitive pixels 30a in the entire detection area 30A and all dummy pixels 30b in the dummy area 30B through the six readout circuits 61.

The plurality of first fanout metal structures 612 may be electrically connected to the readout data lines of respective columns of photosensitive pixels 30a and dummy pixels 30b respectively. In some embodiments, the first fanout metal structure 612 may implement electrically connecting the readout circuit 61 to the photosensitive pixel 30a and the dummy pixel 30b by a bimetal layer (for example, Mo—Al bimetal layer) so as to reduce the resistance. Especially in the case of a long connection distance (for example, greater than 5.11 mm), the bimetal layer structure may effectively ensure signal conduction. The electrical connection between the bimetal layer may be achieved by a via hole penetrating through the insulating layer, for example, by more than two square via holes of 4 μm*4 μm.

In FIG. 5, the plurality of readout circuits in the two groups of readout circuits 61 are alternately arranged in the row direction (i.e., the left and right direction in FIG. 4B), so that each photosensitive pixel 30a within the detection area 30A may be driven by different readout circuits 102 according to the area, thereby simplifying the circuit layout and data processing, and further facilitate realizing reading uniformity of the signal by way of wiring with equal resistance. In some embodiments, the readout circuit 61 may be an integrated circuit arranged on the film, namely ROIC COF (Chip on Film). That is, the readout circuit is attached to the outer periphery of the optical sensor array substrate 30 through the film.

Referring to FIG. 4B, in some embodiments, the optical sensor array substrate 30 is rectangular, and the gate circuit 62 and the flexible circuit board 63 may be both arranged on the third side of the optical sensor array substrate 30, wherein the third side is adjacent to both the first side and the second side. In FIG. 5, the pins 621 of the two gate circuits 62 are electrically connected to each row of photosensitive pixels 30a and dummy pixels 30b through the second fanout metal structure 622 in the bonding area 30E respectively.

In some embodiments, the plurality of first fanout metal structures 612 may be electrically connected to the gate lines of respective columns of photosensitive pixels 30a and dummy pixels 30b. The second fanout metal structure 622 may also implement electrically connecting the gate circuit 62 to the photosensitive pixel 30a by a bimetal layer (for example, Mo—Al bimetal layer)

In some embodiments, the bimetal layer includes a first metal layer and a second metal layer. The first metal layer is located in the same layer and has the same material as the readout data line. The second metal layer is located in the same layer and has the same material as the gate line, and is electrically connected to the first metal layer through a via hole penetrating through the gate insulating layer.

The gate circuit 62 is configured to control the switching of each row of photosensitive pixels 30a and dummy pixels 30b. The driving circuit board 10 may be connected to the pin 621 of the gate circuit 62 through the pin 631 of the flexible circuit board 63 so as to turn on or off one or more rows of photosensitive pixels and dummy pixels through an input signal.

In order to reduce the resistance of the metal trace 64, in some embodiments, the width of the metal trace 64 may be greater than 40 μm. Referring to FIG. 4B, in order to prevent the light around the optical sensor array substrate 30 from disturbing the detection area 30A and the dummy area 30B, in some embodiments, the optical fingerprint reader further includes a light-absorbing plastic frame 30D, for example a black light-absorbing plastic frame. The light-absorbing plastic frame 30D is located on one side of the optical sensor array substrate 30 away from the backlight module 20. A light-absorbing portion of the light-absorbing plastic frame 30D may cover the peripheral area 30R and expose the dummy area 30B, for example covering the respective pins of the readout circuit 61, the gate circuit 62 and the flexible circuit board 63 and their bonding areas 30E. In this way, the detection area 30A and the dummy area 30B may be exposed from a non-light-absorbing portion of the light-absorbing plastic frame 30D, so that it is possible to sense the light and also possible to prevent the disturbance of the ambient light.

Figure 6:
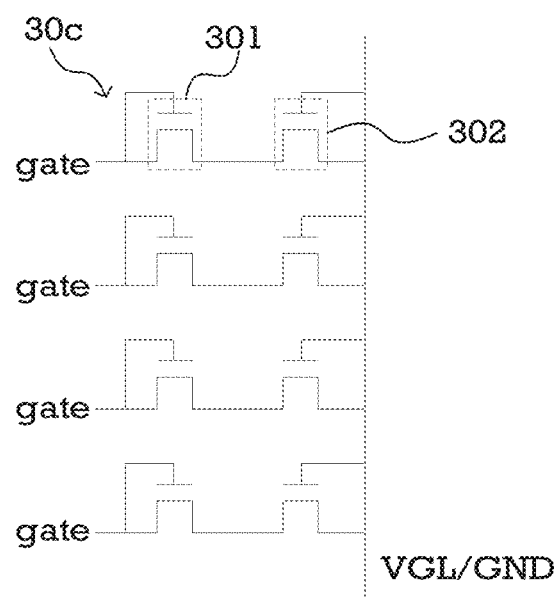
FIG. 6 is a schematic view of the principle of the electrostatic discharge circuit in an embodiment of the optical sensor array substrate according to the present disclosure.

FIG. 6 is a schematic view of the principle of the electrostatic discharge circuit in an embodiment of the optical sensor array substrate according to the present disclosure.

Referring to FIGS. 4B and 5, in some embodiments, the optical sensor array substrate further includes an electrostatic discharge area 30C, which may be located on one side of the dummy area 30B away from the detection area 30A. The plurality of electrostatic discharge units 30c are arranged according to a column direction. Referring to FIG. 6, in some embodiments, the electrostatic discharge unit 30c includes a first transistor 301 and a second transistor 302. Each of the first transistor 301 and the second transistor 302 includes a gate, a source and a drain. The gate of the first transistor 301 is electrically connected to the drain of the first transistor 301 and connected to the gate signal output terminal (gate) of the gate circuit 62.

The drain of the second transistor 302 is electrically connected to the source of the first transistor 301, and the gate of the second transistor 302 and the source of the second transistor 302 are both connected to a first voltage terminal with a lower voltage, for example VGL or GND. The voltage of the first voltage terminal is lower than the gate signal voltage of the gate signal output terminal (gate). The first transistor 301 and the second transistor 302 may realize a N-type heavily doped conductive area so as to complete a current path conductive in a forward direction and a reverse direction.

When a normal gate signal passes through the electrostatic discharge unit 30c corresponding to each row of pixels, the source and drain of the first transistor 301 are turned on, and the source and drain of the second transistor 302 are turned off, thereby presenting such a state that the electrostatic discharge unit 30c is turned off. When an abnormally high voltage signal generated by static electricity is generated, the gate of the first transistor 301 may be at a high potential, so that the source and drain of the first transistor 301 are turned on. At this time, this voltage signal reaches the drain of the second transistor 302 via the source and drain of the first transistor 301. The abnormally high voltage signal may allow the second transistor 302 to reach an edge of breakdown, such that this voltage signal reaches VGL or GND via the drain and source of the second transistor 302, thereby realizing electrostatic discharge and avoiding damage to the optical fingerprint reader resulting from static electricity entering the detection area 30A, the dummy area 30B and each of the driving circuits.

Referring to FIGS. 4A-6, in some embodiments, a plurality of electrostatic discharge units arranged according to a column direction correspond to the plurality of rows of photosensitive pixels 30a in the detection area 30A and the dummy pixels 30b in the dummy area 30B in a one-to-one correspondence. That is, each electrostatic discharge unit 30c corresponds to a row of photosensitive pixels 30a and a row of dummy pixels 30b.

Figure 7A:
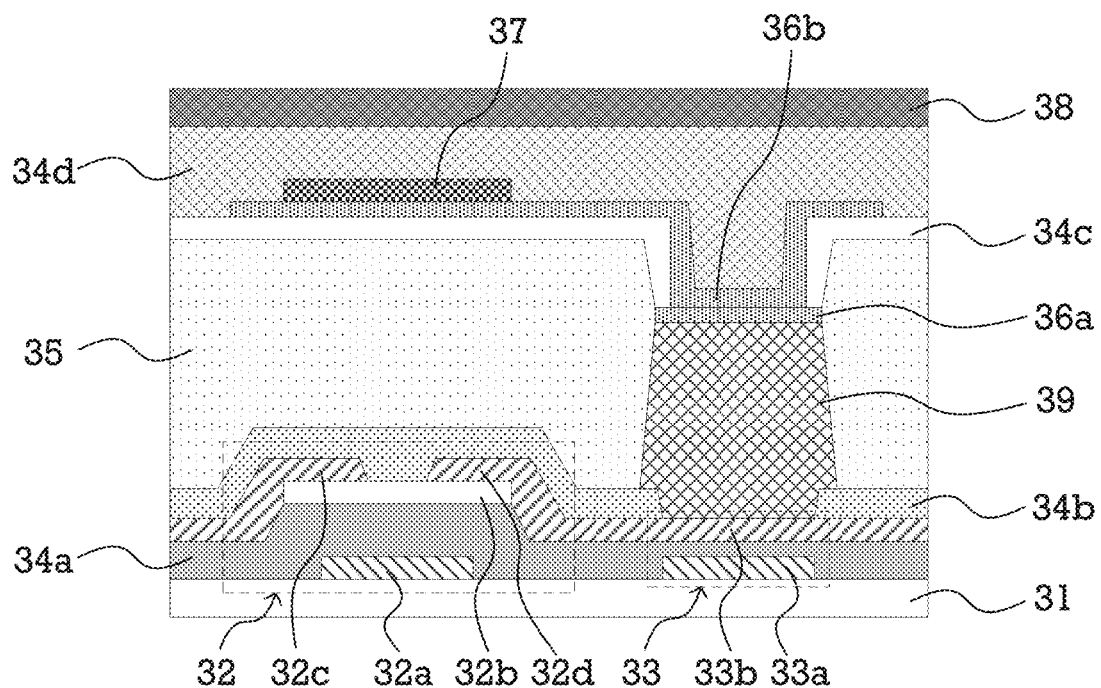
FIGS. 7A and 7B are schematic views of the structure of the detection area and the dummy area in FIG. 5 respectively.
Figure 7B:
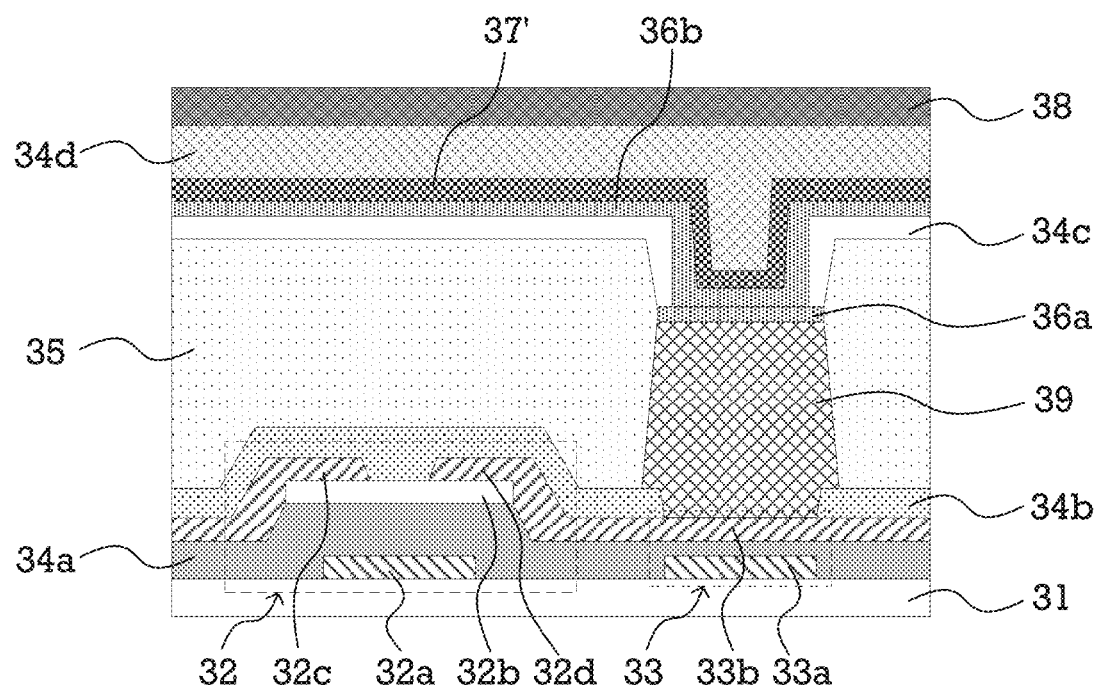
Figure 7C:
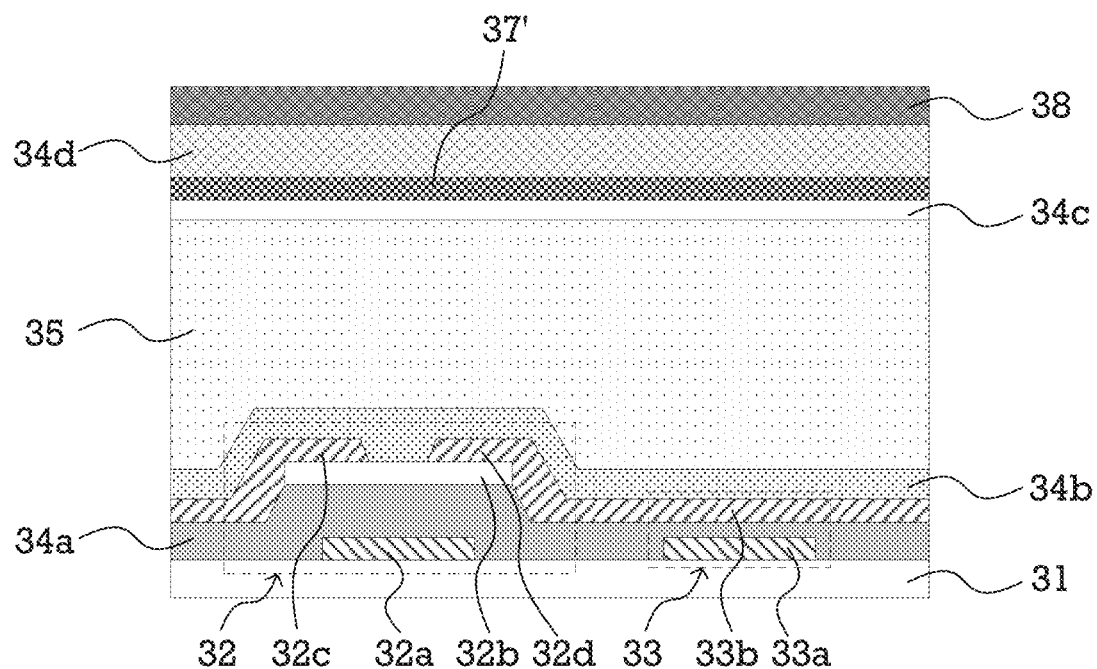
FIGS. 7C-7E are schematic views of the dummy area in some embodiments of the optical sensor array substrate according to the present disclosure.
Figure 7D:
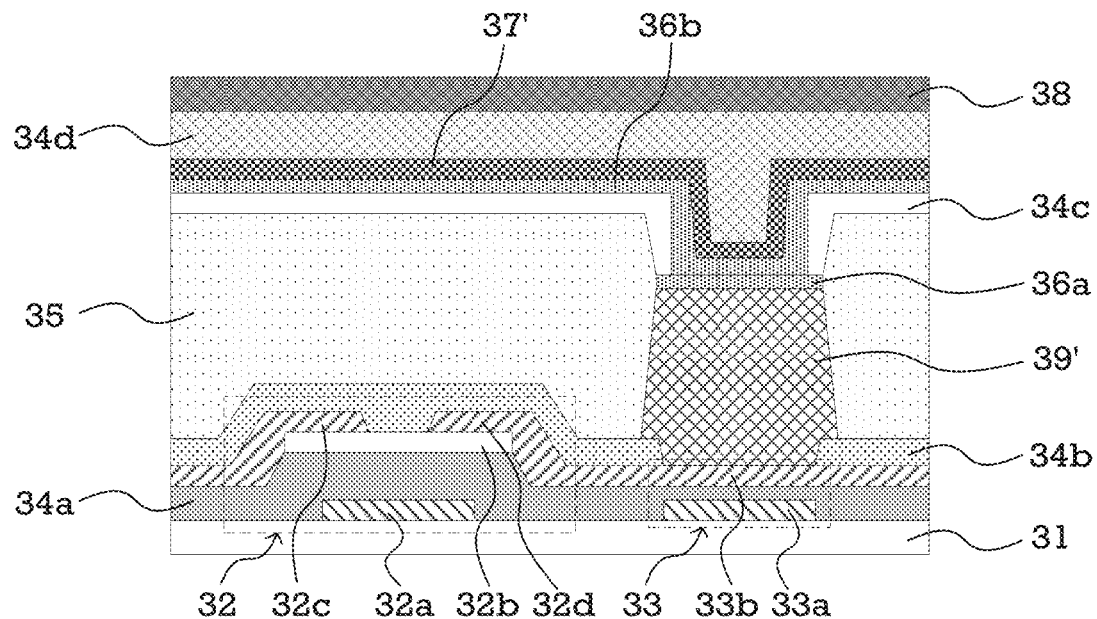
Figure 7E:
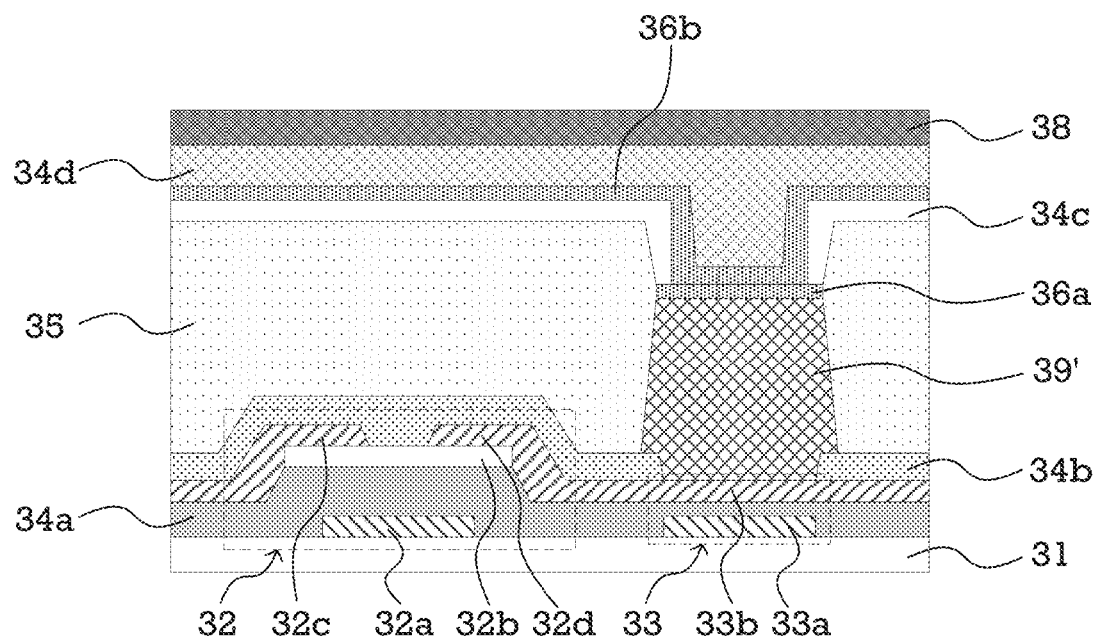
Figure 7F:
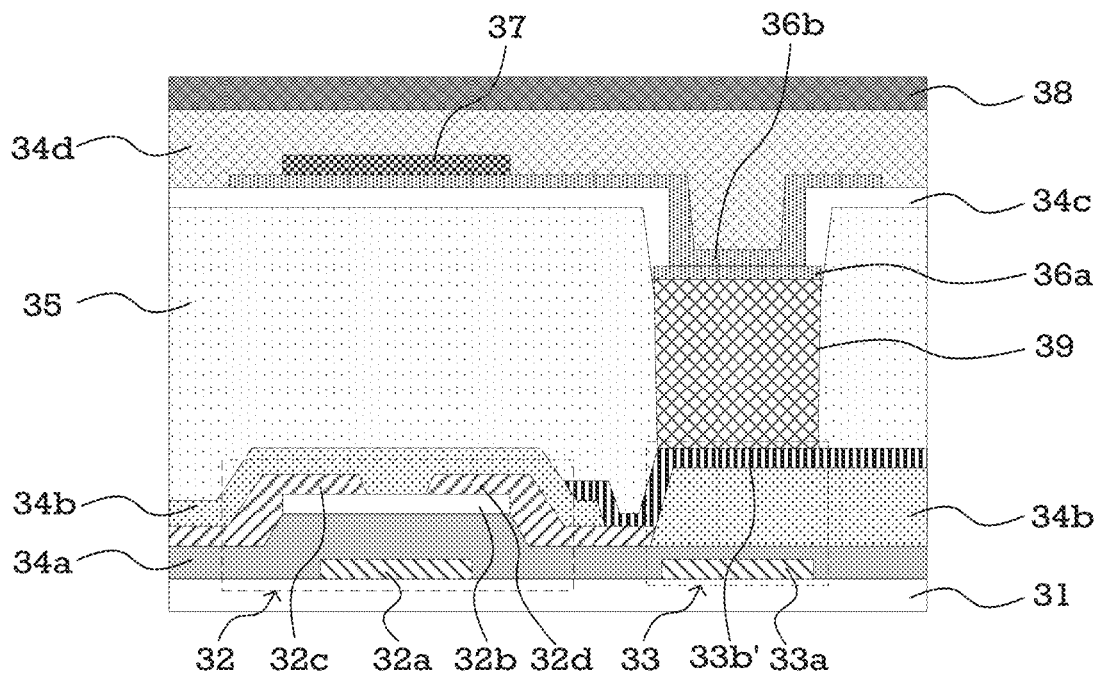
FIG. 7F is a schematic view of the structure of the detection area in another embodiment of the optical sensor array substrate according to the present disclosure.

FIGS. 7A and 7B are schematic views of the structure of the detection area and the dummy area in FIG. 5 respectively. FIGS. 7C-7E are schematic views of the dummy area in some embodiments of the optical sensor array substrate according to the present disclosure. FIG. 7F is a schematic view of the structure of the detection area in another embodiment of the optical sensor array substrate according to the present disclosure. FIGS. 8A and 8B are schematic views of the coverage areas of the light-shielding metal layer in the detection area and the dummy area in FIG. 5.

Referring to FIG. 7A, the photosensitive pixel 30a includes a thin film transistor (referred to TFT for short) 32 and a storage capacitor 33 located on the substrate 31, a photosensitive element 39 and a first light-shielding metal layer 37. The TFT 32 which is electrically connected to both the storage capacitor 33 and the photosensitive element 39, may be configured to control an operation state of the photosensitive element 39.

Referring to FIG. 8A, the first light-shielding metal layer (also referred to as a top metal) 37 is located on one side of the TFT 32 and the photosensitive element 39 away from the substrate 31d, and a coverage range of the first light-shielding metal layer is part of the photosensitive pixels. The orthographic projection of the first light-shielding metal layer 37 on the substrate 31 at least partially overlaps with the orthographic projection of the TFT 32 on the substrate 31, and does not overlap with the orthographic projection of the photosensitive element 39 on the substrate 31. This is favorable for preventing light from adversely affecting the TFT (for example, current leakage resulting from sensitization of the TFT), without affecting the photosensitive element 39 in receiving light.

Referring to FIG. 7B, the dummy pixel 30b includes a TFT 32 and a storage capacitor 33 located on a substrate 31, a photosensitive element 39, and a second light-shielding metal layer 37'. The thin film transistor 32 is electrically connected to both the storage capacitor 33 and the photosensitive element 39. In some embodiments, the photosensitive pixel 30a and the dummy pixel 30b may use the same or different TFT 32, storage capacitor 33, and photosensitive element 39. In some embodiments, the photosensitive element 39 may include a photoelectric diode.

Referring to FIG. 8B, the second light-shielding metal layer 37' is located on one side of the TFT 32 and the photosensitive element 39 away from the substrate 31d. Correspondingly, the orthographic projection of the thin film transistor 32 and the photosensitive element 39 on the substrate 31 is located within the orthographic projection of the second light-shielding metal layer 37' on the substrate 31. This is favorable for preventing light from adversely affecting the TFT (for example, current leakage resulting from sensitization of the TFT), and also avoids the photosensitive element 39 in the dummy pixel 30b from receiving light. In some embodiments, each of the plurality of dummy pixels 30b includes a second light-shielding metal layer 37', and the second light-shielding metal layer of the plurality of dummy pixels 30b entirely covers the dummy area.

In FIGS. 7A and 7B, the optical sensor array substrate 30 includes a gate insulating layer 34a, a first passivation layer 34b, a planarization layer 35, and a second passivation layer 34c. The thin film transistor 32 includes a gate 32a, an active layer 32b, a source 32c, and a drain 32d. The gate 32a is located between the substrate 31 and the active layer 32b, and the gate insulating layer 34a is located on one side of the substrate 31 adjacent to the active layer 32b and covers the gate 32a. The source 32c and the drain 32d are located on the surface of one side of the gate insulating layer 34a away from the substrate 31, and electrically connected to the active layer 32b respectively.

The first passivation layer 34b is located on one side of the source 32c and the drain 32d away from the substrate 31, and covers the source 32c and the drain 32d. The planarization layer 35 is located on one side of the first passivation layer 34b away from the substrate 31, and its thickness may be adjusted as needed, for example, 300-1000 nm. The photosensitive element 39 is located within the planarization layer 35. The second passivation layer 34c is located on one side of the planarization layer 35 away from the substrate 31.

The storage capacitor 33 includes a first capacitor plate 33a and a second capacitor plate 33b. The first capacitor plate 33a, and the gate 32a of the TFT 32 are located in the same layer and have the same material, and may be formed by the same patterning process so as to simplify the process. The second capacitor plate 33b, and the source 32c and the drain 32d of the TFT 32 are located in the same layer and have the same material, and may be formed by the same patterning process so as to simplify the process. The second capacitor plate 33b is electrically connected to the source 32c or the drain 32d of the TFT 32, and at least partially overlaps with the orthographic projection of the first capacitor plate 33a on the substrate 31.

Referring to FIG. 7F, in other embodiments, the first capacitor plate 33a and the gate 32a of the thin film transistor 32 are located in the same layer and have the same material, and the second capacitor plate 33b' and the source 32c and the drain 32d of the thin film transistor 32 are located in different layers respectively. For example, in FIG. 7F, the second capacitor plate 33b' is electrically connected to the source 32c or the drain 32d of the TFT 32 through a via hole penetrating through the first passivation layer 34b.

Referring to FIGS. 7A and 7B, in some embodiments, one end of the photosensitive element 39 is electrically connected to the second capacitor plate 33b through a via hole penetrating through the first passivation layer 34b. In some embodiments, the second capacitor plate 33b is also served as the bottom electrode of the photosensitive element 39. The orthographic projection of the photosensitive element 39 on the substrate 31 is located within the orthographic projections of the second capacitor plate 33b and the first capacitor plate 33a on the substrate 31. The first capacitor plate 33a and the second capacitor plate 33b are formed of an opaque metal, for example Au, Mu, Al or the like, so that the first capacitor plate 33a and the second capacitor plate 33b may shield the backlight on the lower side of the photosensitive element 30 and eliminate the disturbance of the backlight on the photosensitive element 30.

A first electrode layer 36a is provided at another end of the photosensitive element 39, and the first electrode layer 36a is electrically connected to the photosensitive element 39. The first electrode layer 36a may increase area of a conductive electrode of the photosensitive element 39. The first electrode layer 36a may be formed of indium tin oxide (referred to ITO for short).

A second electrode layer 36b that is electrically connected to the bias voltage signal terminal may also be provided on one side of the second passivation layer 34c away from the substrate 31, and the second electrode layer 36b is electrically connected to the first electrode layer 36a through a via hole penetrating through the second passivation layer 34c and the planarization layer 35. The second electrode layer 36b may be formed of an ITO material.

The orthographic projection of the first electrode layer 36a on the substrate 31 at least partially overlaps with the orthographic projection of the second capacitor plate 33b on the substrate 31, such that it is possible to effectively increase the charge storage capacity of the pixel and improve the resistance to intense light of the optical fingerprint reader in a form in which the storage capacitor 33 formed by the first capacitor plate 33a and the second capacitor plate 33b is connected in parallel with the storage capacitor formed by the first capacitor electrode layer 36a and the second capacitor plate 33b.

Referring to FIGS. 7A and 7B, in some embodiments, the optical sensor array substrate 30 further includes a third passivation layer 34d and an electrostatic shielding layer 38, wherein the third passivation layer 34d is located on one side of the second passivation layer 34c away from the substrate 31, and covers the second electrode layer 36b, the first light-shielding metal layer 37 and the second light-shielding metal layer 37'. The electrostatic shielding layer 38 is located on one side of the third passivation layer 34d away from the substrate 31, and is grounded to eliminate static electricity on the surface by conduction.

In other embodiments, the dummy pixel 30b may also be in other structures. For example, referring to FIG. 7C, in some embodiments, the dummy pixel 30b may not include the photosensitive element 39. The dummy area includes a plurality of dummy pixels 30b, at least one of which includes: a TFT 32, a storage capacitor 33, and a second light-shielding metal layer 37'. The second light-shielding metal layer 37' is located on one side of the TFT 32 away from the substrate 31, and the orthographic projection of the TFT 32 on the substrate 31 is located within the orthographic projection of the second light-shielding metal layer on the substrate 31. Compared with the photosensitive pixel 30a, the dummy pixel 30b includes the same insulating layers as in the photosensitive pixel 30a at a position corresponding to the photosensitive element 39.

Referring to FIG. 7D, in some embodiments, the dummy pixel 30b may further include a dummy element 39' in addition to the TFT 32, the storage capacitor 33, and the second light-shielding metal layer 37'. The dummy element 39' includes a material that has the same dielectric constant as the photosensitive element 39 and does not have a photosensitive property. Both ends of the dummy element 39' may be electrically connected to the second capacitor plate 33b and the first electrode layer 36a respectively. The dummy pixel 30b may include the second light-shielding metal layer 37', or may not include the second light-shielding metal layer 37'. The second light-shielding metal layer 37' is located on one side of the TFT 32 away from the substrate 31, and the orthographic projection of the TFT 32 on the substrate 31 is located within the orthographic projection of the second light-shielding metal layer on the substrate 31. Referring to FIG. 7E, in other embodiments, the second light-shielding metal layer 37' may be omitted on the basis of the embodiment in FIG. 7D.

FIG. 9 is a schematic view of overlapping the gate with the source and the drain of the TFT in an embodiment of the optical sensor array substrate according to the present disclosure. FIG. 10A is a schematic view of the arrangement of a readout data line and a source and drain of the TFT in an embodiment of the optical sensor array substrate according to the present disclosure. FIG. 10B is a schematic view of the arrangement of a gate line and a gate of the TFT in an embodiment of the optical sensor array substrate according to the present disclosure.

Referring to FIGS. 9 and 10A, in some embodiments, the orthographic projection of the gate 32a of the TFT 32 on the substrate 31 partially overlaps with the orthographic projections of the drain 32d and the source 32c of the TFT 32 on the substrate 31 respectively, with an overlapped portion A shown in FIG. 9. The orthographic projection of the active layer 32b on the substrate 31 also partially overlaps with the overlapped portion A.

Referring to FIG. 9, in some embodiments, the photosensitive pixel 30a (which may also be a dummy pixel 30b) includes: a readout data line 321 extending along a first direction y and a gate line 322 extending along a second direction x. The second direction x is perpendicular to the first direction y. In FIG. 10B, the gate line 322 and the gate 32a of the TFT 32 are located in the same layer and connected (the gate line 322 and the gate 32a are divided by a dotted line), wherein one end of the gate 32a of the TFT 32 is connected to the gate line 322, and another end thereof extends along the first direction y relative to the gate line 322.

In FIG. 10A, the readout data line 321 and the source 32c of the TFT 32 are located in the same layer and connected (the readout data line 321 and the source 32c are divided by a dotted line), wherein one end of the source 32c is connected to the readout data line 321, and another end of the source 32c extends along the second direction x relative to the readout data line 321. The drain 32d of the TFT 32 is L-shaped, and has a first portion 32d1, a second portion 32d2, and a corner portion 32d3. The corner portion 32d3 connects the first portion 32d1 and the second portion 32d2. The first portion 32d1 extends along a direction opposite to the first direction y relative to the corner portion 32d3, and the second portion 32d2 extends along a direction opposite to the second direction x relative to the corner portion 32d3.

By way of the structures of the TFT shown in FIGS. 10A and 10B, it is possible to obtain the effect that the orthographic projection of the gate 32a of the TFT 32 on the substrate 31 partially overlaps with the orthographic projections of both the drain 32d and source 32c of the TFT 32 on the substrate 31 respectively.

Compared with the related art where the drain and source of the TFT are strip portions parallel to each other, in this embodiment, it is possible to reduce an overlapped area of the orthographic projections of the drain 32d and source 32c of the TFT 32 on the substrate 31 with the orthographic projection of the gate 32a on the substrate 31, thereby reducing the capacitance formed by the drain 32d, the source 32c and the gate 32a, and then reducing the noise of the optical sensor array substrate 30.

Figure 11:
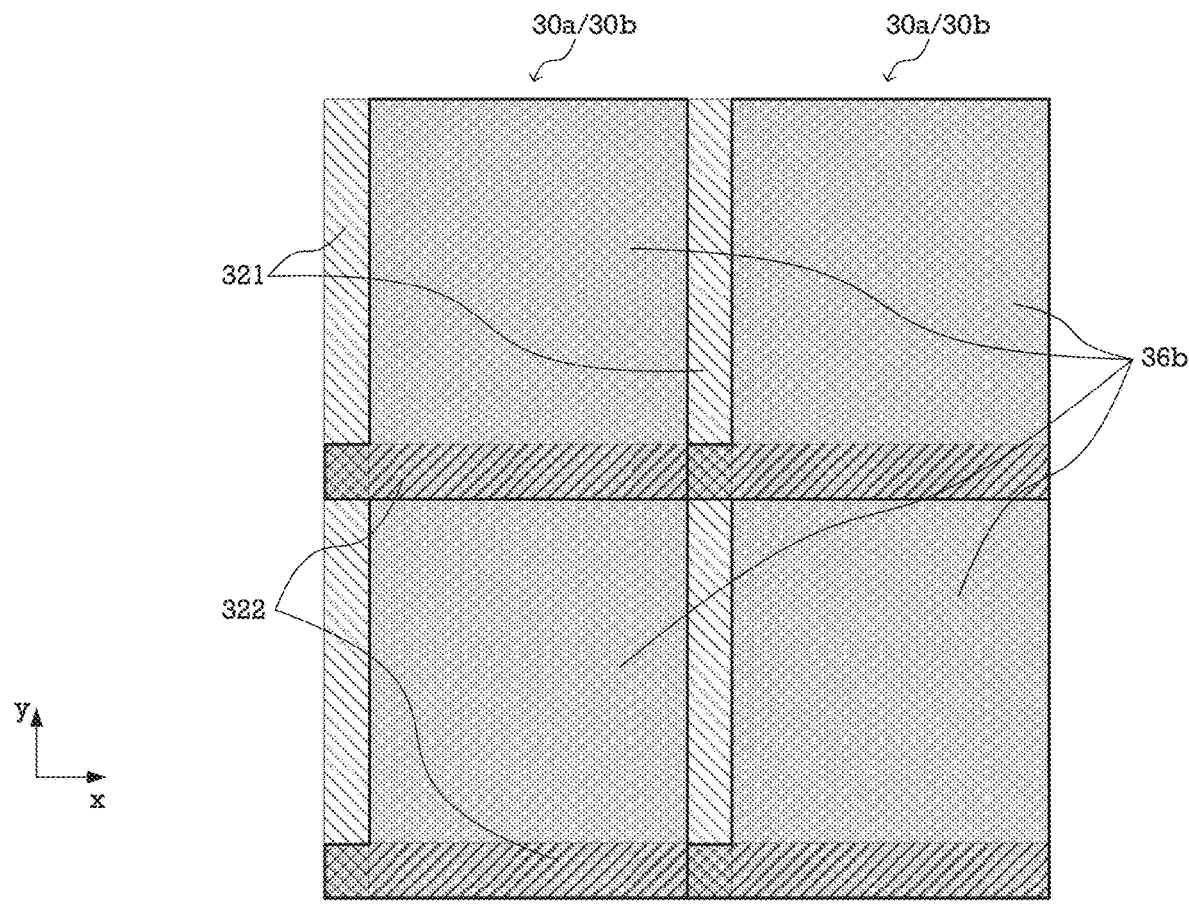
FIG. 11 is a schematic view of the arrangement of a readout data line, a gate line and a second electrode layer in photosensitive pixels or dummy pixels arranged in an array in an embodiment of the optical sensor array substrate according to the present disclosure.

FIG. 11 is a schematic view of the arrangement of a readout data line, a gate line and a second electrode layer in photosensitive pixels or dummy pixels arranged in an array in an embodiment of the optical sensor array substrate according to the present disclosure.

Referring to FIGS. 5, 7A, 7B, and 11, in some embodiments, the plurality of photosensitive pixels 30a and the plurality of dummy pixels 30b are arranged in a plurality of rows and a plurality of columns according to a row direction (for example, the second direction x) and a column direction (for example, the first direction y) of an array. FIG. 11 shows a total of four adjacent photosensitive pixels 30a or dummy pixels 30b in two rows and two columns. Each column of photosensitive pixels 30a (which may also be each column of dummy pixels 30b) include a readout data line 321 continuously extending along the column direction and a gate line 322 continuously extending along the row direction.

The second electrode layers 36b of each row of photosensitive pixels 30a are all sequentially connected along the column direction to form an entirety of the second electrode layer. In order to reduce the disturbance of the readout data line 321 by the capacitance formed by the second electrode layer 36b and the readout data line 321, it is possible to allow that the orthographic projection of an entirety of the second electrode layer on the substrate 31 partially overlaps with the orthographic projection of each row of photosensitive pixels 30a on the substrate 31, and does not partially or wholly overlap with the readout data line 321 of each row of photosensitive pixels 30a. In this way, by reducing or eliminating a projection overlapped area between the second electrode layer 36b and the readout data line 321, it is possible to effectively reduce the capacitance formed by the second electrode layer 36b and the readout data line 321, thereby reducing the disturbance of this capacitance on the readout data line 321.

Similarly, the second electrode layers 36b of the dummy pixels 30b are all sequentially connected to an entirety of the second electrode layer along the column direction. In order to reduce the disturbance of the capacitance formed by the second electrode layer 36b and the readout data line 321 on the readout data line 321, it is possible to allow that the orthographic projection of an entirety of the second electrode layer on the substrate 31 partially overlaps with the orthographic projection of each column of dummy pixels 30b on the substrate 31, and does not partially or wholly overlap with the readout data line 321 of each column of dummy pixels 30b. In this way, by reducing or eliminating a projection overlapped area between the second electrode layer 36b and the readout data line 321, it is possible to effectively reduce the capacitance formed by the second electrode layer 36b and the readout data line 321, thereby reducing the disturbance of this capacitance on the readout data line 321.

Each of the embodiments of the above-described optical sensor array substrate according to the present disclosure may be applied to various devices for detecting a surface texture of an object, for example, detecting fingerprints or palm prints of a person. Correspondingly, the present disclosure provides an optical fingerprint reader including the foregoing optical sensor array substrate, which may realize fingerprint identification and detection of a single finger or a plurality of fingers (for example, two fingers, three fingers, or four fingers), or identification and detection of palmprints.

The optical fingerprint reader may be used for fingerprint acquisition and detection in application scenarios such as customs security.

Hereto, various embodiments of the present disclosure have been described in detail. Some details well known in the art are not described in order to avoid obscuring the concept of the present disclosure. According to the above description, those skilled in the art would fully understand how to implement the technical solutions disclosed here.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed:

1. An optical sensor array substrate, comprising a substrate, the substrate comprising a detection area and a peripheral area surrounding the detection area, wherein, the detection area comprises a plurality of photosensitive pixels, at least one of which comprises:
   a thin film transistor arranged on the substrate and having a gate, an active layer, a source and a drain;
   a storage capacitor arranged on the substrate and having a first capacitor plate and a second capacitor plate, wherein the second capacitor plate is located on one side of the first capacitor plate away from the substrate and electrically connected to the source or drain of the thin film transistor;
   a photosensitive element located on one side of the storage capacitor away from the substrate and having one end electrically connected to the second capacitor plate;
   a first electrode layer located on one side of the photosensitive element away from the substrate and electrically connected to another end of the photosensitive element,
   wherein an orthographic projection of the second capacitor plate on the substrate at least partially overlaps with an orthographic projection of the first electrode layer on the substrate, and the first capacitor plate is located in the same layer and has the same material as the gate of the thin film transistor.

2. The optical sensor array substrate according to claim 1, wherein an orthographic projection of the photosensitive element on the substrate is located within orthographic projections of the second capacitor plate and the first capacitor plate on the substrate.

3. The optical sensor array substrate according to claim 1, wherein the photosensitive pixels comprise:
   a readout data line extending along a first direction, and located in the same layer as and connected to the source of the thin film transistor; and
   a gate line extending along a second direction, and located in the same layer as and connected to the gate of the thin film transistor, wherein the second direction is perpendicular to the first direction;
   wherein one end of the source of the thin film transistor is connected to the readout data line, and another end of the source of the thin film transistor extends along the second direction relative to the readout data line;

the drain of the thin film transistor is L-shaped, and has a first portion, a second portion, and a corner portion connecting the first portion and the second portion, wherein the first portion extends along a direction opposite to the first direction relative to the corner portion, and the second portion extends along a direction opposite to the second direction relative to the corner portion;

one end of the gate of the thin film transistor is connected to the gate line, and another end of the gate of the thin film transistor extends along the first direction relative to the gate line, wherein an orthographic projection of the gate of the thin film transistor on the substrate partially overlaps with orthographic projections of both the drain and the source of the thin film transistor on the substrate respectively.

4. The optical sensor array substrate according to claim 1, wherein at least one of the plurality of photosensitive pixels further comprises:

a first light-shielding metal layer located on one side of the thin film transistor and the photosensitive element away from the substrate, wherein an orthographic projection of the first light-shielding metal layer on the substrate at least partially overlaps with an orthographic projection of the thin film transistor on the substrate, and an orthographic projection of the first light-shielding metal layer does not overlap with an orthographic projection of the photosensitive element on the substrate.

5. The optical sensor array substrate according to claim 1, wherein the peripheral area comprises a dummy area located on at least one side of the detection area, the dummy area comprises a plurality of dummy pixels, at least one of the plurality of dummy pixels comprises the thin film transistor, the storage capacitor, the photosensitive element, the first electrode layer and the second light-shielding metal layer, wherein the second light-shielding metal layer is located on one side of the thin film transistor and the photosensitive element away from the substrate, and an orthographic projection of the thin film transistor and the photosensitive element on the substrate is located within an orthographic projection of the second light-shielding metal layer on the substrate.

6. The optical sensor array substrate according to claim 5, wherein each of the plurality of dummy pixels comprises the second light-shielding metal layer, and the second light-shielding metal layer of the plurality of dummy pixels entirely covers the dummy area.

7. The optical sensor array substrate according to claim 5, wherein at least one of the plurality of dummy pixels and the plurality of photosensitive pixels comprises:

a gate insulating layer located on one side of the substrate adjacent to the active layer of the thin film transistor and covering the gate of the thin film transistor;

a first passivation layer located on one side of the source and the drain of the thin film transistor away from the substrate, and covers the source and the drain of the thin film transistor;

a planarization layer located on one side of the first passivation layer away from the substrate;

a second passivation layer located on one side of the planarization layer away from the substrate, wherein the source and the drain of the thin film transistor are located on a surface of one side of the gate insulating layer away from the substrate, the photosensitive element is located within the planarization layer and electrically connected to the second capacitor plate through a via hole penetrating through the first passivation layer, and the first electrode layer is electrically connected to the photosensitive element.

8. The optical sensor array substrate according to claim 7, wherein at least one of the plurality of dummy pixels and the plurality of photosensitive pixels comprises:

a second electrode layer electrically connected to a bias voltage signal terminal, located on one side of the second passivation layer away from the substrate, and electrically connected to the first electrode layer through a via hole penetrating through the second passivation layer and the planarization layer.

9. The optical sensor array substrate according to claim 8, wherein the plurality of photosensitive pixels and the plurality of dummy pixels are arranged in a plurality of rows and a plurality of columns according to a row direction and a column direction of an array, and each column of photosensitive pixels and each column of dummy pixels both comprise a readout data line continuously extending along the column direction and a gate line continuously extending along the row direction;

wherein second electrode layers of each row of photosensitive pixels are sequentially connected along the column direction to form an entirety of the second electrode layer, and an orthographic projection of the entirety of the second electrode layer on the substrate partially overlaps with an orthographic projection of each column of photosensitive pixels on the substrate, and does not partially or wholly overlap with the readout data line of each column of photosensitive pixels; and/or second electrode layers of each column of dummy pixels are sequentially connected along the column direction to form an entirety of the second electrode layer, and an orthographic projection of the entirety of the second electrode layer on the substrate partially overlaps with an orthographic projection of each column of dummy pixels on the substrate, and does not partially or wholly overlap with the readout data line of each column of dummy pixels.

10. The optical sensor array substrate according to claim 9, wherein at least one of the plurality of dummy pixels and the plurality of photosensitive pixels comprises:

a third passivation layer located on one side of the second passivation layer away from the substrate; and an electrostatic shielding layer located on one side of the third passivation layer away from the substrate.

11. The optical sensor array substrate according to claim 9, wherein the peripheral area comprises a bonding area located on at least one side of the detection area; the bonding area comprises:

a plurality of first fanout metal structures electrically connected to readout data lines of respective columns of photosensitive pixels and dummy pixels; and a plurality of second fanout metal structures electrically connected to gate lines of respective rows of photosensitive pixels and dummy pixels.

12. The optical sensor array substrate according to claim 11, wherein at least one of the plurality of first fanout metal structures and the plurality of second fanout metal structures comprises a bimetal layer comprising:

a first metal layer located in the same layer and having the same material as the readout data lines; and a second metal layer located in the same layer and having the same material as the gate lines, and electrically connected to the first metal layer through a via hole penetrating through the gate insulating layer.

13. The optical sensor array substrate according to claim 5, further comprising:
an electrostatic discharge area located on one side of the dummy area away from the detection area and having a plurality of electrostatic discharge circuits,
wherein the plurality of photosensitive pixels and the plurality of dummy pixels are arranged in a plurality of rows and a plurality of columns according to a row direction and a column direction of an array, wherein the plurality of electrostatic discharge circuits are arranged according to the column direction, and in a one-to-one correspondence with the plurality of rows of photosensitive pixels and dummy pixels.

14. The optical sensor array substrate according to claim 13, wherein at least one of the plurality of electrostatic discharge circuits comprises:
a first transistor having a gate, a source and a drain;
a second transistor having a gate, a source and a drain,
wherein the gate of the first transistor is electrically connected to the drain of the first transistor, and configured to be connected to a gate signal output terminal of a gate circuit, the drain of the second transistor is electrically connected to the source of the first transistor, the gate of the second transistor and the source of the second transistor are both configured to be connected to a first voltage terminal, and a voltage of the first voltage terminal is lower than a gate signal voltage of the gate signal output terminal.

15. An optical fingerprint reader, comprising:
a backlight;
the optical sensor array substrate according to claim 1, which is located on a light emitting side of the backlight; and
a driving circuit board electrically connected to the backlight and signally connected to the optical sensor array substrate.

16. The optical fingerprint reader according to claim 15, further comprising:
a filter layer located on one side of the optical sensor array substrate away from the backlight,
wherein a material of the filter layer comprises a filter material which is configured to intercept light beyond a preset wavelength range and transmit light within a preset wavelength range, wherein the preset wavelength range is 450~500 nm.

17. The optical fingerprint reader according to claim 16, further comprising:
a hard coating layer located on one side of the filter layer away from the backlight,
wherein a material of the hard coating layer comprises a periodic laminated structure formed by two materials of $SiO_2$ and $Si_3C_4$ alternately.

18. The optical fingerprint reader according to claim 15, wherein the backlight comprises:
a backplane;
a light guide plate located on one side of the backplane adjacent to the optical sensor array substrate;
a reverse prism located on a surface of one side of the light guide plate away from the backplane; and
a privacy film located on a surface of one side of the reverse prism away from the backplane.

19. The optical fingerprint reader according to claim 15, further comprising:
two groups of readout circuits located on a first side and a second side of the optical sensor array substrate and electrically connected to the driving circuit board, wherein the first side is a side opposite to the second side,
wherein the optical sensor array substrate has two dummy areas located on a third side and a fourth side of the detection area, wherein the third side is a side opposite to the fourth side, and the third side and the fourth side are both adjacent to the first side and the second side;
the dummy area comprises a plurality of dummy pixels; the plurality of photosensitive pixels and the plurality of dummy pixels are arranged in a plurality of rows and a plurality of columns according to a row direction and a column direction of an array, and collectively divided into a plurality of pixel groups according to columns; and
each group of readout circuits comprise a plurality of readout circuits; pins of all the readout circuits among the two groups of readout circuits are electrically connected to the plurality of pixel groups in a one-to-one correspondence through a first fanout metal structure, and all the readout circuits among the two groups of readout circuits are alternately arranged in the row direction.

20. The optical fingerprint reader according to claim 19, further comprising:
two gate circuits located on a third side of the optical sensor array substrate and electrically connected to the plurality of photosensitive pixels and the plurality of dummy pixels through a second fanout metal structure; and
a flexible circuit board located on a third side of the optical sensor array substrate and located between the two gate circuits, such that pins of the flexible circuit board are electrically connected to pins of the two gate circuits, and electrically connected to the driving circuit board through a metal trace,
wherein the metal trace has a width of greater than 40 μm.

* * * * *